(12) United States Patent
Wacaser et al.

(10) Patent No.: US 10,714,303 B2
(45) Date of Patent: Jul. 14, 2020

(54) ENABLING HIGH THROUGHPUT ELECTRON CHANNELING CONTRAST IMAGING (ECCI) BY VARYING ELECTRON BEAM ENERGY

(71) Applicant: International Business Machines Corporation, Armonk, NY (US)

(72) Inventors: Brent A. Wacaser, Putnam Valley, NY (US); Devendra K. Sadana, Pleasantville, NY (US); Stephen W. Bedell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/039,855

(22) Filed: Jul. 19, 2018

(65) Prior Publication Data
US 2020/0027690 A1    Jan. 23, 2020

(51) Int. Cl.
*H01J 37/00*    (2006.01)
*H01J 37/147*    (2006.01)
*G01N 23/207*    (2018.01)

(52) U.S. Cl.
CPC ........ *H01J 37/1478* (2013.01); *G01N 23/207* (2013.01); *G01N 2223/401* (2013.01); *G01N 2223/418* (2013.01); *H01J 2237/1506* (2013.01)

(58) Field of Classification Search
CPC .......... H01J 37/1478; H01J 2237/1506; G01N 23/207; G01N 2223/418; G01N 2223/401
USPC .................................. 250/306, 307, 310, 311
See application file for complete search history.

(56) References Cited

U.S. PATENT DOCUMENTS

| | | | |
|---|---|---|---|
| 6,414,308 B1 * | 7/2002 | Bowley, Jr. ........... | H01J 37/222 250/307 |
| 6,462,340 B1 * | 10/2002 | Inokuti ................ | G01N 23/207 250/310 |
| 6,768,324 B1 * | 7/2004 | Yamada ............... | G01R 31/307 324/754.22 |
| 7,253,645 B2 | 8/2007 | Talbot et al. | |
| 7,319,225 B2 | 1/2008 | Kasai et al. | |
| 7,397,031 B2 | 7/2008 | Shinada et al. | |

(Continued)

FOREIGN PATENT DOCUMENTS

| TW | 473892 B | 1/2002 |
|---|---|---|
| WO | WO2017025392 A1 | 2/2017 |

OTHER PUBLICATIONS

Electron Microscopy Tutorial, Advanced Microscopy, The University of Utah (downloaded May 8, 2018) (7 pages).

(Continued)

*Primary Examiner* — Michael Maskell
(74) *Attorney, Agent, or Firm* — Vazken Alexanian; Michael J. Chang, LLC (57) ABSTRACT

Techniques for high throughput electron channeling contrast imaging (ECCI) by varying electron beam energy are provided. In one aspect, a method for ECCI of a crystalline wafer includes: placing the crystalline wafer under an electron microscope having an angle of less than 90° relative to a surface of the crystalline wafer; generating an electron beam, by the electron microscope, incident on the crystalline wafer; varying an accelerating voltage of the electron microscope to access a channeling condition of the crystalline wafer; and obtaining an image of the crystalline wafer. A system for ECCI is also provided.

18 Claims, 5 Drawing Sheets

(56) References Cited

U.S. PATENT DOCUMENTS

| | | | |
|---|---|---|---|
| 7,838,830 B2 | 11/2010 | Frosien et al. | |
| 7,956,324 B2 | 6/2011 | Takahashi et al. | |
| 9,739,728 B1 * | 8/2017 | Bedell | G06K 9/4671 |
| 9,741,532 B1 | 8/2017 | Bedell et al. | |
| 9,859,091 B1 | 1/2018 | Bedell et al. | |
| 2006/0231752 A1 * | 10/2006 | Houge | G01N 23/203 |
| | | | 250/306 |
| 2011/0108736 A1 * | 5/2011 | Preikszas | H01J 37/1478 |
| | | | 250/397 |
| 2015/0001393 A1 * | 1/2015 | Kotake | H01J 37/24 |
| | | | 250/307 |
| 2016/0126058 A1 * | 5/2016 | Ominami | H01J 37/20 |
| | | | 250/307 |

OTHER PUBLICATIONS

Via, G "SEM Slope Compensation Device" IBM TDB n6b 11-90 p. 442-444, IPCOM000102540D, Mar. 17, 2005.

English Abstract of TW473892B by Yamada et al., Jan. 21, 2002.

\* cited by examiner

ENABLING HIGH THROUGHPUT ELECTRON CHANNELING CONTRAST IMAGING (ECCI) BY VARYING ELECTRON BEAM ENERGY

FIELD OF THE INVENTION

The present invention relates to electron channeling contrast imaging (ECCI), and more particularly, to techniques for high throughput ECCI by varying electron beam energy.

BACKGROUND OF THE INVENTION

In manufacturing of microelectronics, defects in the crystalline quality of the material adversely affect its quality. With the addition of materials like germanium (Ge) and III-V materials into the manufacturing line, defects caused by the epitaxy and processing of dissimilar materials are more abundant than with silicon (Si)-only technologies. It is therefore important to test the defect density and other properties in order to control the growth and processing in the line.

However, many testing techniques require cutting, polishing, and or thinning of samples in order to retrieve this information. While some non-destructive techniques are available, they are not compatible with high throughput processing.

Therefore, accurate, high throughput wafer imaging techniques would be desirable.

SUMMARY OF THE INVENTION

The present invention provides techniques for high throughput electron channeling contrast imaging (ECCI) by varying electron beam energy. In one aspect of the invention, a method for ECCI of a crystalline wafer is provided. The method includes: placing the crystalline wafer under an electron microscope having an angle of less than 90° relative to a surface of the crystalline wafer; generating an electron beam by the electron microscope, incident on the crystalline wafer; varying an accelerating voltage of the electron microscope to access a channeling condition of the crystalline wafer; and obtaining an image of the crystalline wafer.

In another aspect of the invention, a system for ECCI is provided. The system includes: a stage; and an electron microscope positioned over the stage, the electron microscope having an angle of less than 90° relative to a surface of the stage.

A more complete understanding of the present invention, as well as further features and advantages of the present invention, will be obtained by reference to the following detailed description and drawings.

DETAILED DESCRIPTION OF PREFERRED EMBODIMENTS

Provided herein are fixed and variable tilt angle, high throughput techniques for electron channeling contrast imaging (ECCI) of crystalline wafers. ECCI is an electron microscope-based process such as scanning electron microscope (SEM). Advantageously, as will be described in detail below, the present techniques leverage changing the accelerating voltage of the SEM to access different channeling conditions.

ECCI of a crystalline wafer generally involves channeling electrons, from an electron beam, into the wafer. To do so, the electron beam has to be aligned with the crystal structure of the wafer so that the electrons can penetrate deep into the wafer structure. Defects interfere with the channeling. Namely, the electrons bounce off of defects rather than channeling through them. Thus, defects in the images obtained can be discerned.

Inter-wafer and intra-wafer variations can make it challenging to accurately align the electron beam correctly to get channeling. This alignment can involve physically tilting the wafer and/or the electron beam to achieve the proper channeling angle. See, for example, U.S. Pat. No. 9,859,091 issued to Bedell et al., entitled "Automatic Alignment for High Throughput Electron Channeling Contrast Imaging" (hereinafter "U.S. Pat. No. 9,859,091"), the contents of which are incorporated by reference as if fully set forth herein.

However, physically tilting a wafer for imaging can present logistical challenges in certain situations, such as when the wafers are large (i.e., wafers having a diameter of greater than or equal to 300 millimeters (mm) (i.e., 300 mm+)). Namely, even at a low tilt angle, the wafers need to have a significant amount of clearance in order to perform the tilt in the tool. By way of example only, a 3 degree tilt for a 300 mm wafer would require a 15.7 mm clearance in the tool. Thus, for all intents and purposes large (e.g., 300 mm+) wafers do not have a tilt capability.

Further, even when the wafer can be physically tilted, ECCI requires a fine tuning of the tilt to optimize images and a tilt angle commensurate with the electron beam and material being imaged. Thus, needing to physically tilt the wafers being imaged can conflict with the requirements necessary for repeatability and high throughput. However, according to the present techniques, fine tuning can be achieved via accelerating voltage tuning.

Namely, the present techniques advantageously employ tuning the accelerating voltage to access different channeling conditions. This accelerating voltage tuning can be implemented in conjunction with some physical tilting of the wafer (e.g., so as to fine tune the image) or, in some cases, in lieu of physically tilting the wafer. In the latter case, the physical angle between the SEM and the wafer can remain fixed. As such, even larger wafers (e.g., 300 mm+wafers) can be easily and quickly processed by the tool.

Figure 1:
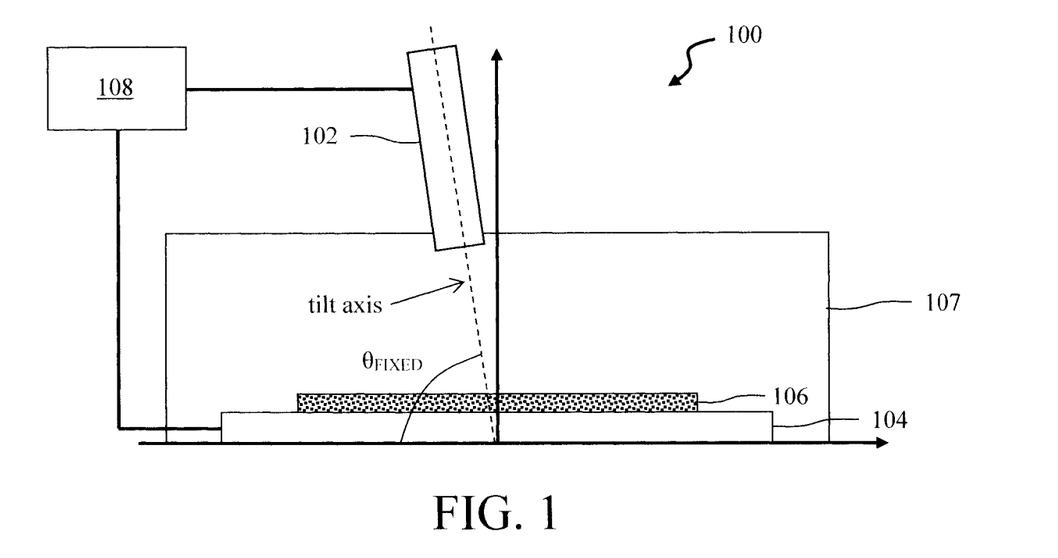
FIG. 1 is a diagram illustrating an exemplary electron channeling contrast imaging (ECCI) system having a fixed tilt angle according to an embodiment of the present invention.

FIG. 1 illustrates an exemplary ECCI imaging system 100 in accordance with the present techniques. As shown in FIG. 1, system 100 includes an electron microscope 102 and a stage 104 (contained within a vacuum chamber 107). According to an exemplary embodiment, electron microscope 102 is an SEM.

In this particular embodiment, the electron microscope 102 is oriented at a fixed angle $\theta_{FIXED}$ relative to the surface of stage 104. By 'fixed' it is meant that the angle of the electron microscope 102 relative to the stage 104 does not change during scanning. It is notable however, that embodiments are also contemplated herein where the tilt of the stage and/or the microscope can be adjusted during scanning to access different channeling conditions. Advantageously, with a non-fixed angle/tiltable system (see, e.g., FIG. 2—described below), course adjustments can be made by physically tilting the microscope and/or stage, while fine-tuning adjustments are made via accelerating voltage correction, or vice versa. Also, with either system (tiltable and non-tiltable) both course and fine-tuning adjustments can be made via accelerating voltage changes at larger/smaller increments, respectively. See below.

Angle $\theta_{FIXED}$ is less than 90 degrees (°). For example, according to an exemplary embodiment, angle $\theta_{FIXED}$ is from about 80° to about 89.5°, and ranges therebetween. Angle $\theta_{FIXED}$ can be achieved by tilting the electron microscope 102 relative to the stage 104 or vice versa. The tilt axis is depicted with a dotted line in FIG. 1. This angle to the tilt axis can be achieved using either a variable mechanism or fixed mechanism. For example, motors or other mechanical means that change the tilt of the stage 104 and/or electron microscope 102 can be utilized. The angle to the tilt axis can also be achieved by variably adjusting voltages and currents associated with the electron optics and scanning coils in the electron beam or moving and/or adjusting apertures. Another option is to fabricate a sample chuck to hold the wafer at a fixed angle. Finally, a fixed stage or microscope modification could be fabricated to achieve a microscope with fixed tilt angle. The notion is that once this angle has been achieved it does not need to be adjusted to access nor fine tune the channeling condition. As will be described below, in one exemplary embodiment the stage 104 can rotate. However, the angle between the electron microscope 102 and the surface of stage 104 is fixed and does not change to access different channeling conditions in a wafer 106 being imaged. Rotating the stage 104/wafer 106 relative to the tilt axis can be used to access different channeling conditions. According to an exemplary embodiment, stage 104 is a motorized stage the position of which can be controlled by a control module 108 which is connected to the stage. An apparatus that can be configured to serve as control module 108 is described in conjunction with the description of FIG. 6, below. Alternatively, in the case of a non-rotatable stage 104 the wafer 106 can be loaded onto the stage in different orientations using a notch of the wafer (see below) for reference. As will be described in detail below, the notch is related to the crystal orientation of the single crystal wafer.

As shown in FIG. 1, the electron microscope 102 can also be operated via control module 108. For instance, control module 108 can regulate turning electron microscope 102 on/off as well as varying the accelerating voltage for accessing different ECCI channeling conditions (see below).

Wafer 106 is a crystalline wafer. For instance, wafer 106 can be a single crystal silicon (Si) wafer. Wafer 106 may further include one or more crystalline materials formed on the wafer. For instance, materials such as germanium (Ge), silicon germanium (SiGe) and/or III-V materials may be epitaxially grown on (e.g., Si) wafer. The term "III-V" refers to materials containing at least one Group III element, and at least one Group V element, e.g., gallium arsenide (GaAs). According to one exemplary, non-limiting embodiment, wafer 106 has a diameter of greater than or equal to about 300 mm.

While the fixed tilt angle design shown in FIG. 1 provides savings in terms of the clearance that would be needed to physically tilt large wafers in the tool, embodiments are also contemplated herein where some tilt of the wafer/stage is employed in conjunction with varying the accelerating voltage for accessing different ECCI channeling conditions. See, for example, FIG. 2.

Figure 2:
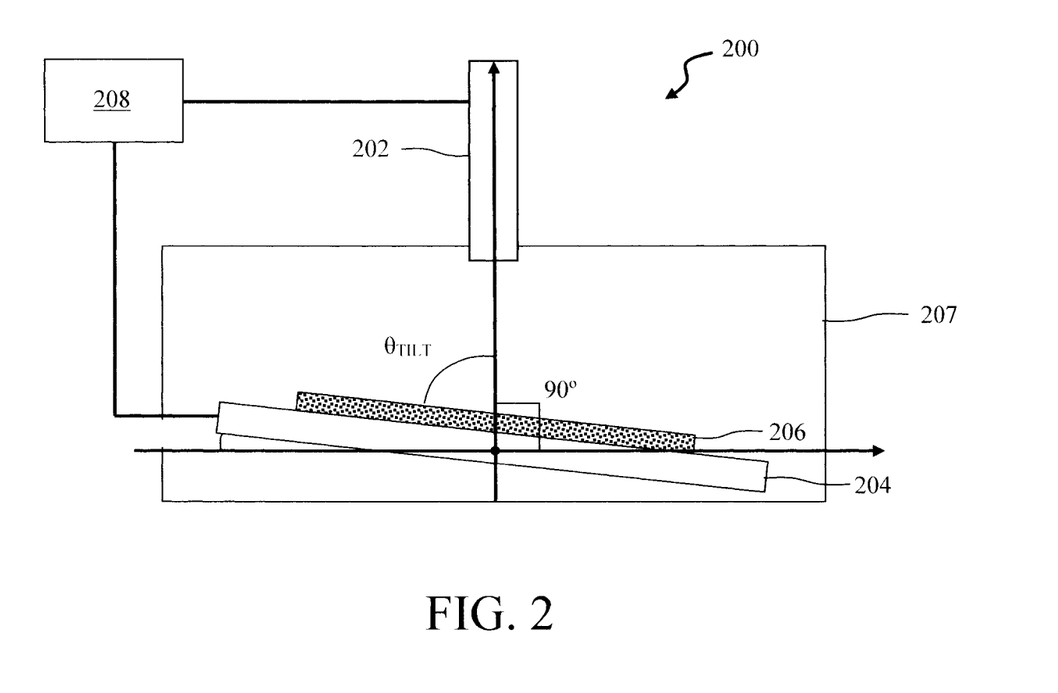
FIG. 2 is a diagram illustrating an exemplary ECCI imaging system having a variable tilt (i.e., tiltable) stage according to an embodiment of the present invention

FIG. 2 illustrates an exemplary ECCI imaging system 200 in accordance with another embodiment of the present techniques. As shown in FIG. 2, system 200 includes an electron microscope 202 and a tiltable stage 204 (contained within a vacuum chamber 207). According to an exemplary embodiment, electron microscope 202 is an SEM.

Electron microscope 202 is oriented at an angle of about 90° (orthogonal) relative to a surface of the stage 204 when the stage is horizontal. However, in this example the stage 204 is tiltable to place the surface of the wafer at an angle $\theta_{TILT}$ relative to the electron microscope 202 of less than 90° (e.g., from about 80° to about 89.5° and ranges therebetween). According to an exemplary embodiment, the stage 204 is motorized and the angle $\theta_{TILT}$ can be controlled by a control module 208 which is connected to the stage. An apparatus that can be configured to serve as control module 208 is described in conjunction with the description of FIG. 6, below. However, embodiments are also contemplated herein where the stage can be tilted manually or by other suitable means to the desired to angle $\theta_{TILT}$.

As shown in FIG. 2, the electron microscope 202 can also be operated via control module 208. For instance, control module 208 can regulate turning electron microscope 202 on/off as well as varying the accelerating voltage for accessing different ECCI channeling conditions (see below).

Figure 3:
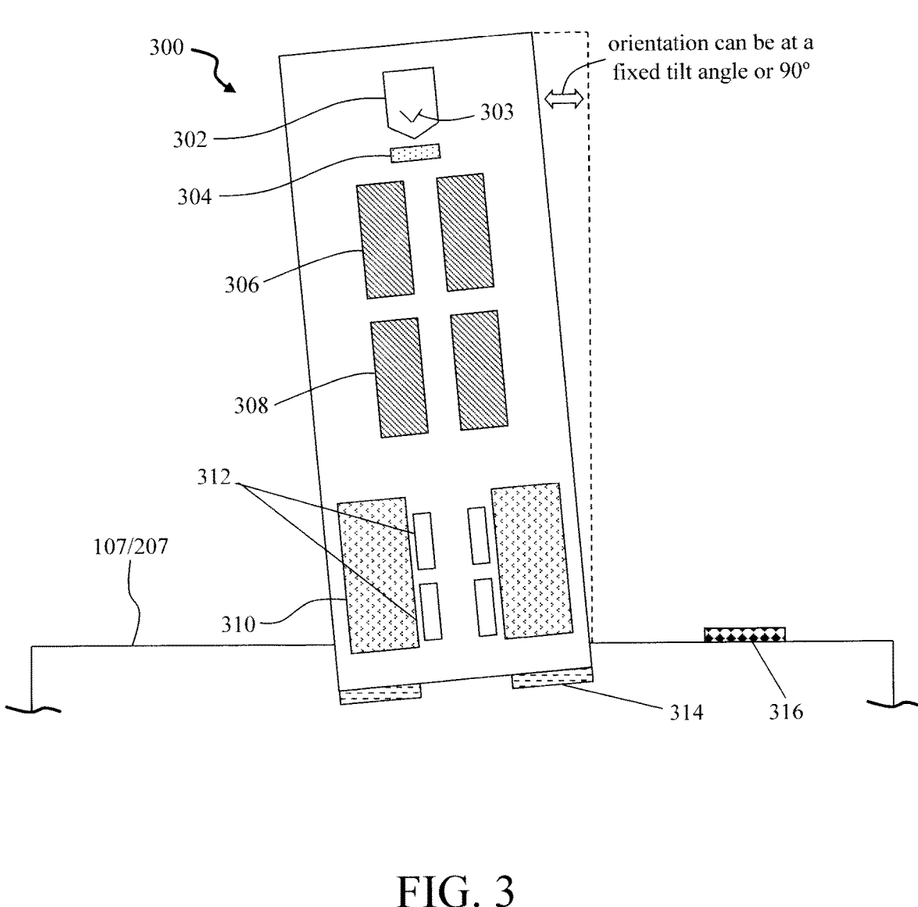
FIG. 3 is a diagram illustrating an exemplary configuration of an electron microscope in the present ECCI imaging systems according to an embodiment of the present invention.

An exemplary configuration of an electron microscope 300 that may be implemented in accordance with the present techniques is shown in FIG. 3. For instance, electron microscope 300 is representative of electron microscope 102 in system 100 and/or electron microscope 202 in system 200. Thus, as shown in FIG. 3, electron microscope 300 can be oriented relative to a vacuum chamber 107/207 at a fixed tilt angle such as in system 100 or at approximately 90° such as in system 200, respectively.

In the example shown in FIG. 3, electron microscope 300 includes an electron source 302 (for generating an electron beam), an anode 304, first and second condenser lenses 306 and 308, objective lenses 310, and deflection coils 312. Detectors 314 and optional secondary detectors 316 are used to detect electrons travelling back from the sample.

Typically, a filament cathode 303 within the electron source 302 is heated for electron emission. The voltage difference between the filament cathode 303 and the anode 304, i.e., the accelerating voltage, accelerates the electron beam toward the anode 304. The accelerating voltage determines the velocity at which the electrons exit the electron microscope 300.

Changing the accelerating voltage will change the landing energy of the electrons and, according to the de Broglie equation, will change the wave length and thus the electron interactions with the crystalline wafer. Namely, according to de Broglie every particle propagates as a wave having a wavelength λ based on the momentum of the particle (i.e., the product of the particle's mass m and velocity v), wherein the particle velocity v is determined by the accelerating voltage. See, for example, Electron Microscopy Tutorial, Advanced Microscopy. The University of Utah (downloaded May 8, 2018) (7 pages), the contents of which are incorporated by reference as if fully set forth herein. Specifically, the wavelength of an electron is dependent on the accelerating voltage as follows:

$$\lambda = \frac{12.5 * 10^{-10}}{\sqrt{V}},$$

wherein $\lambda$ is the wavelength, and V is the accelerating voltage of the microscope.

As described in conjunction with the description of FIG. 1 above, a fixed tilt angle $\theta_{FIXED}$ of the electron microscope relative to the surface of the stage/wafer can be employed that is less than 90° (e.g., from about 80° to about 89.5° and ranges therebetween). Specifically, if the fixed tilt angle was at 90°, then the electron beam would be directed at the (100) pole of the wafer which is not a Bragg condition for the sample. In that case, changing the electron landing energy (see above) would not affect the channeling condition for ECCI. Alternatively, as described in conjunction with the description of FIG. 2 above, when the electron microscope is orthogonal to the stage, the stage can be titled to place the surface of the wafer at an angle $\theta_{TILT}$ relative to the electron microscope of less than 90° (e.g., from about 80° to about 89.5° and ranges therebetween).

The Bragg condition is a condition for which the wavelength of the electrons (see above) interacts with the atoms in a crystal in such a way that the electrons are either all reflected or, as desired in the instant embodiments, are all channeled into the sample material. This condition depends on the planar spacing d of the atoms in the crystal and the angle $\theta$ that the electrons make between the crystal and the atoms in it.

The Bragg condition may be expressed as:

$$2d \sin \theta = n\lambda,$$

where n is any positive whole integer. For example, taking n=1 for the smallest Bragg angle:

$$\theta = \arcsin\left(\frac{\lambda}{2d}\right) = \arcsin\left(12.25 \frac{10^{-10}}{(2*d*\sqrt{V})}\right).$$

So, for a fixed d spacing, i.e., a certain planar spacing or crystal orientation of a certain material, one can either tilt the sample to the correct angle to find the Bragg condition (see, for example, U.S. Pat. No. 9,859,091) or one can vary the accelerating voltage (with either a fixed tilt angle or a tiltable stage) which changes the wavelength of the incoming electrons and thus changes the Bragg condition. Thus, advantageously, a varying accelerating voltage can be used to find the correct Bragg condition to make the image. See, for example, methodology 400 of FIG. 4.

Figure 4:
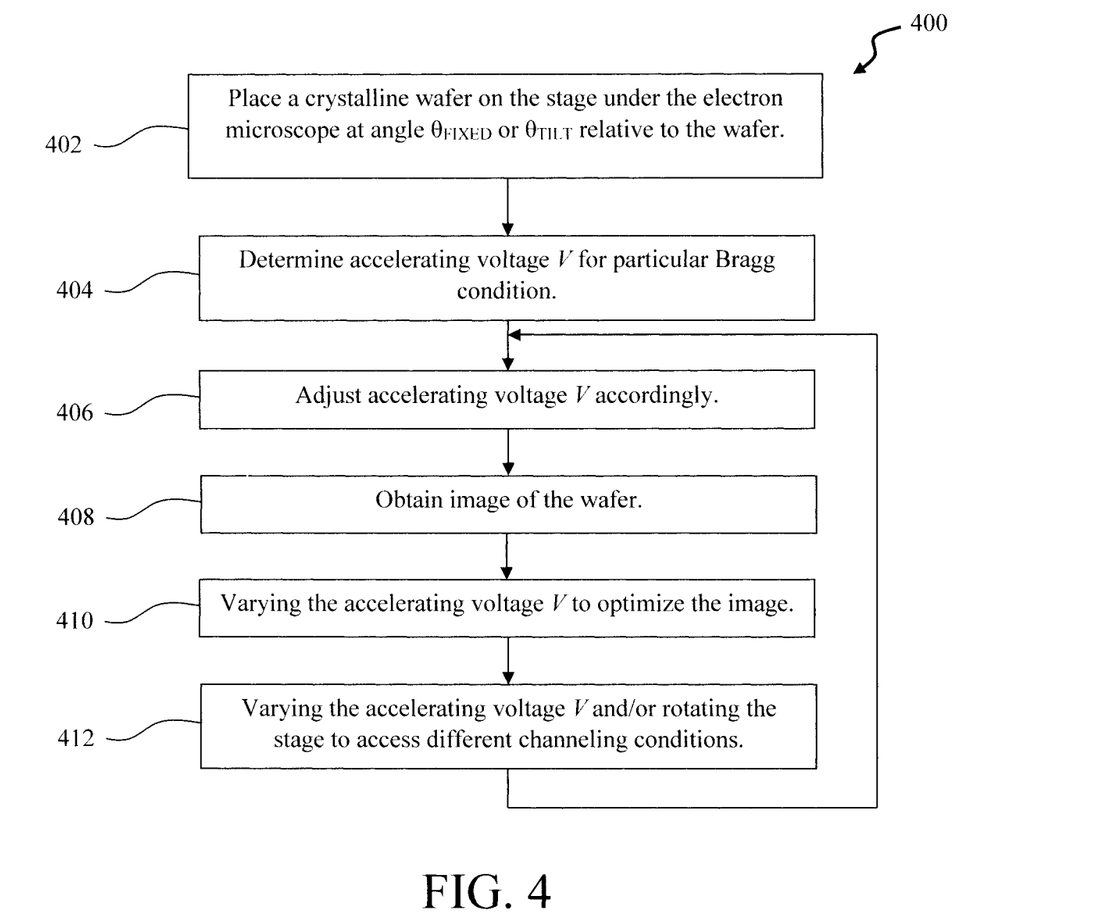
FIG. 4 is a diagram illustrating an exemplary methodology for ECCI imaging of a crystalline wafer according to an embodiment of the present invention.

Methodology 400 for ECCI imaging of a crystalline wafer may be performed using either imaging system 100 (of FIG. 1) or imaging system 200 (of FIG. 2). For instance, in step 402 a crystalline wafer 106 is positioned on the stage 104 under electron microscope 102. With system 100, the electron microscope 102 is at a fixed tilt angle $\theta_{FIXED}$ (relative to the surface of the stage 104/wafer 106) of less than 90°, e.g., from about 80° to about 89.5° and ranges therebetween.

With system 200, the stage 204 is tilted to place the surface of the wafer 206 at an angle $\theta_{TILT}$ relative to the electron microscope of less than 90° (e.g., from about 80° to about 89.5° and ranges therebetween).

It is assumed in the present example that the crystal orientation of the wafer 106 is known. As provided above, for a given the planar spacing d, varying the accelerating voltage changes the Bragg condition (i.e., the angle $\theta$ at which the electrons are all channeled into the sample material) by changing the wavelength of the incoming electrons. Thus, it becomes a straightforward process to calculate the certain given accelerating voltage that produces a Bragg condition equal to the angle $\theta_{FIXED}$ or $\theta_{TILT}$ of the electron microscope relative to the surface of the wafer. See step 404. According to an exemplary embodiment, this calculation is performed by the respective control module 108 (system 100) or control module 208 (of system 200).

In step 406, the accelerating voltage V of the electron microscope is adjusted accordingly (i.e., to the value calculated in step 404) to generate an electron beam incident on the wafer. According to an exemplary embodiment, the accelerating voltage V of the electron microscope is adjusted via the respective control module 108 (system 100) or control module 208 (of system 200) in an automated manner based on the calculation performed in step 404. In step 408, the electron microscope is then used to obtain an image of the wafer.

In practice, the calculation of the Bragg condition gets close to the optimal condition, but due to wafer variation and stage variations the angle may need to be fined tuned. For instance, after getting close to the correct Bragg condition by, as described above, either a combination of a fixed tilt (as per system 100) and coarse accelerating voltage corrections (as per step 406) or tilting the stage (as per system 200) the Bragg condition and image can be optimized and fine-tuned by a fine accelerating voltage correction in step 410. Namely, the correction performed in step 410 will involve a small change in V whereas the changes to V in step 406 will be larger. By way of example only, according to an exemplary embodiment, the coarse adjustments will change the accelerating voltage in increments of from about 1 kilovolt (kV) to about 10 kV and ranges therebetween to adjust the Bragg conditions by large amounts (i.e., course adjustments made in step 406) to arrive at near a calculated Bragg condition. The fine-tuning made in step 410 will adjust the acceleration voltage in increments of from about 0.01 kV to about 0.1 kV and ranges therebetween to fine-tune the Bragg conditions in order to optimize imaging conditions. These values correspond to changing the angle in course increments of from about 0.1 degrees to about 1 degree and ranges therebetween for the rough changes, and by changing the angle in fine-tuning increments of from about 0.01 degrees to about 0.1 degrees and ranges therebetween.

Changing the Bragg condition and/or changing the orientation of the wafer can be used to access different channeling conditions. See step 412. As described in detail above, the Bragg condition can be changed by varying the accelerating voltage V. The orientation of the wafer can be changed by rotating the stage. According to an exemplary embodiment, both operations are performed in an automated manner via the respective control module 108 (system 100) or control module 208 (of system 200). For instance, as described above, the stage can be motorized and under the control of the control module. Alternatively, the orientation of the wafer can be changed by extracting the wafer from the tool, rotating the wafer by other means, and then re-inserting the wafer into the tool.

As shown in FIG. 4, the process is then reiterated with new Bragg conditions/orientations. It is notable that two different Bragg conditions highlight different types of defects and give better or worse contrast depending on how the defects perturb the crystal structure. Thus, with the present techniques different Bragg conditions can be accessed by only changing accelerating voltage V and thus highlighting different defects.

Figure 5:
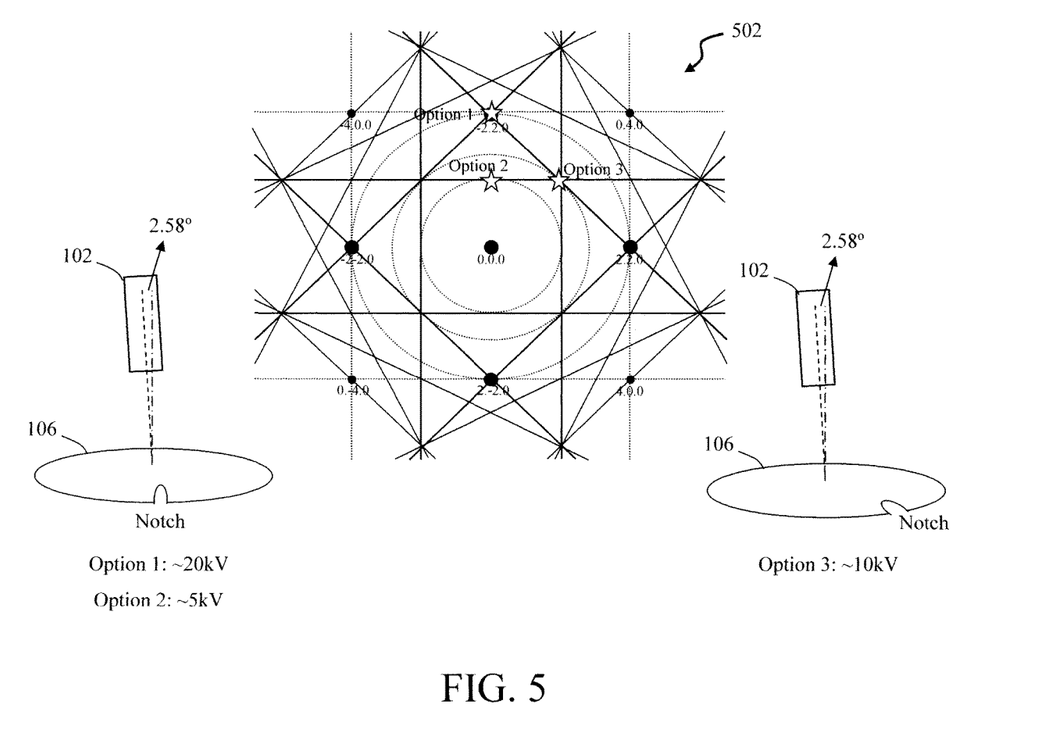
FIG. 5 is a diagram illustrating an exemplary implementation of the present techniques for ECCI imaging by varying electron beam energy according to an embodiment of the present invention.

The present techniques are further described by way of reference to the non-limiting example provided in FIG. 5. In this example, it is assumed that crystalline Si wafer has a (100) surface crystal orientation and the electron microscope having a fixed tilt angle of 87.42°, i.e., 90°-87.42°=2.58° is used to access three different channeling conditions in the crystalline wafer. A schematic representation 502 of the crystal structure of wafer is provided with lines being used to indicate angles for which the electron beam will be channeling down a specific crystal orientation. With a crystal structure there will be conditions where multiple channeling conditions cross, meaning that the electron beam will be channeling down two different crystal orientations at the same angles. Where lines cross is a point in this three-dimensional (3D) space where one or more crystal orientations are aligned. In microscopy, this is referred to as a two-beam condition because it is an angle where two crystal orientations are interacting with the electron beam at the same time.

As is further illustrated in FIG. 5, a notch is used to indicate a particular crystal orientation of the wafer 106. In this example, the notch aligns with the (011) crystal orientation as is conventional for Si (100) wafers. In production wafers there is high crystalline alignment of wafer surface and notch.

To access the (002) channeling condition, the wafer notch is aligned with the tilt axis of the fixed angle stage and the accelerating voltage is set to ~5 kV. To access the multi-beam crossing of the (004) and (220) channeling condition, the wafer notch is aligned with the tilt axis of the fixed angle stage and the accelerating voltage is set to ~20 kV. To access the multi-beam crossing of the (002) and (220) channeling condition, the wafer notch is aligned at 45° with the tilt axis of the fixed angle stage and the accelerating voltage is set to ~10 kV. Thus, three of the major channeling conditions are accessible with a single system and fixed stage tilt.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
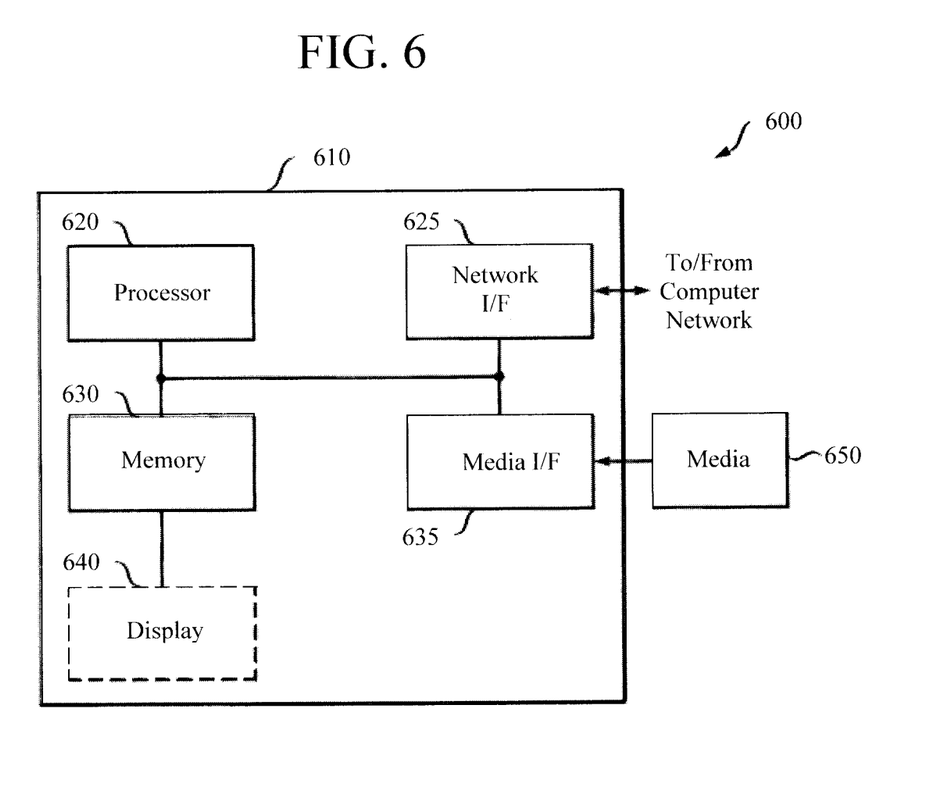
FIG. 6 is a diagram illustrating an exemplary apparatus for performing one or more of the methodologies described herein according to an embodiment of the present invention

Turning now to FIG. 6, a block diagram is shown of an apparatus 600 that can be configured to perform one or more of the methodologies presented herein. For example, apparatus 600 can serve as the control module 108 in system 100 and/or as the control module 208 in system 200 and can be configured to perform one or more of the steps of methodology 400 (of FIG. 4) described above. Apparatus 600 includes a computer system 610 and removable media 650. Computer system 610 includes a processor device 620, a network interface 625, a memory 630, a media interface 635 and an optional display 640. Network interface 625 allows computer system 610 to connect to a network, while media interface 635 allows computer system 610 to interact with media, such as a hard drive or removable media 650.

Processor device 620 can be configured to implement the methods, steps, and functions disclosed herein. The memory 630 could be distributed or local and the processor device 620 could be distributed or singular. The memory 630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 620. With this definition, information on a network, accessible through network interface 625, is still within memory 630 because the processor device 620 can retrieve the information from the network. It should be noted that each distributed processor that makes up processor device 620 generally contains its own addressable memory space. It should also be noted that some or all of computer system 610 can be incorporated into an application-specific or general-use integrated circuit.

Optional display 640 is any type of display suitable for interacting with a human user of apparatus 600. Generally, display 640 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for electron channeling contrast imaging (ECCI) of a crystalline wafer, the method comprising the steps of:
    placing the crystalline wafer under an electron microscope having an angle of less than 90° relative to a surface of the crystalline wafer;
    generating an electron beam, by the electron microscope, incident on the crystalline wafer;
    varying an accelerating voltage of the electron microscope to access a channeling condition of the crystalline wafer;
    varying the accelerating voltage of the electron microscope to access at least one different channeling condition of the crystalline wafer; and
    obtaining an image of the crystalline wafer.

2. The method of claim 1, further comprising the step of:
    varying the accelerating voltage in increments of from about 0.01 kV to about 0.1 kV and ranges therebetween to fine-tune imaging conditions.

3. The method of claim 1, wherein the angle is from about 80° to about 89.5° and ranges therebetween.

4. The method of claim 1, wherein the angle is fixed.

5. The method of claim 1, wherein the crystalline wafer has a diameter of greater than or equal to about 300 millimeters (mm).

6. The method of claim 1, further comprising the step of:
    changing an orientation of the crystalline wafer to access at least one different channeling condition of the crystalline wafer.

7. The method of claim 6, wherein the orientation of the crystalline wafer is changed relative to a tilt axis of the electron microscope.

8. The method of claim 6, wherein the crystalline wafer is placed on a stage below the electron microscope.

9. The method of claim 8, wherein the stage is tiltable, the method further comprising the step of:
    tilting the stage to place the surface of the crystalline wafer at the angle of less than 90° relative to the electron microscope.

10. The method of claim 8, further comprising the step of:
    rotating the stage to change the orientation of the crystalline wafer.

11. The method of claim 8, wherein the stage is motorized and connected to a control module that is configured to rotate the stage.

12. The method of claim 11, wherein the control module is further configured to vary the accelerating voltage of the electron microscope.

13. The method of claim 1, further comprising the steps of:
    calculating a given accelerating voltage that, based on the angle, accesses the channeling condition; and
    adjusting the electron microscope to the given accelerating voltage.

14. A system for ECCI, comprising:
a stage;
a crystalline wafer on the stage;
an electron microscope positioned over the stage, the electron microscope having an angle of less than 90° relative to a surface of the stage; and
a control module that operates the electron microscope, wherein the control module is configured to vary an accelerating voltage of the electron microscope to access different channeling conditions of the crystalline wafer.

15. The system of claim 14, wherein the angle is from about 80° to about 89.5° and ranges therebetween.

16. The system of claim 14, wherein the stage is motorized.

17. The system of claim 16,
wherein the control module is connected to the stage, and wherein the control module is configured to rotate the stage.

18. The system of claim 14, wherein the crystalline wafer has a diameter of greater than or equal to about 300 mm.

\* \* \* \* \*